(12) United States Patent
Qiao et al.

(10) Patent No.: US 12,183,399 B2
(45) Date of Patent: Dec. 31, 2024

(54) MEMORY DEVICE, PROGRAMMING METHOD AND MEMORY SYSTEM

(71) Applicant: Yangtze Memory Technologies Co., Ltd., Hubei (CN)

(72) Inventors: Liang Qiao, Hubei (CN); Bowen Wang, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 116 days.

(21) Appl. No.: 18/147,537

(22) Filed: Dec. 28, 2022

(65) Prior Publication Data

US 2024/0005994 A1 Jan. 4, 2024

(30) Foreign Application Priority Data

Jul. 1, 2022 (CN) .......................... 202210775684.7

(51) Int. Cl.
*G11C 16/10* (2006.01)
*G11C 16/08* (2006.01)
*G11C 16/24* (2006.01)
*G11C 16/04* (2006.01)

(52) U.S. Cl.
CPC .............. *G11C 16/10* (2013.01); *G11C 16/08* (2013.01); *G11C 16/24* (2013.01); *G11C 16/0483* (2013.01)

(58) Field of Classification Search
CPC ............ G11C 16/10; G11C 6/08; G11C 16/24
See application file for complete search history.

(56) References Cited

U.S. PATENT DOCUMENTS

2008/0106947 A1* 5/2008 Cho ....................... G11C 16/08
365/185.23
2022/0036944 A1* 2/2022 Han .................... G11C 16/3427

* cited by examiner

*Primary Examiner* — Han Yang
(74) *Attorney, Agent, or Firm* — Hanley, Flight & Zimmerman, LLC

(57) ABSTRACT

The present application discloses a memory device, a programming method and a memory system. The memory device comprises: a memory cell array comprising a plurality of word lines and a plurality of bit lines; each of the word lines comprising at least two word line segments; each of the word line segment in the word line having different signal transmission distances from a word line driver; different word line segments in the word line corresponding to different bit lines respectively; the word line driver configured to apply a word line voltage to the word line; a bit line driver configured to apply different bias voltages to different bit lines corresponding to the different word line segments respectively during application of a programming pulse.

20 Claims, 5 Drawing Sheets

MEMORY DEVICE, PROGRAMMING METHOD AND MEMORY SYSTEM

TECHNICAL FIELD

The present application relates to the field of semiconductor technology, and in particular, to a memory device, a programming method, and a memory system.

BACKGROUND

Word lines of a three-dimensional memory are driven from one end, and signals on the word lines are transmitted from the one end to the other end. However, in the case where the word lines in the three-dimensional memory are also distributed in three dimensions, such that lengths of the access paths via each word line are different, thus signal loading delay occurs, leading inconsistent signal transmission speed on each word line.

As the number of stacked layers of the three-dimensional memory increases, differences between the access paths via each word line also increase, thus leading the problem of voltage signal loading delay still exists, and even the delay time is more significant, making programming rates of different memory cells which correspond to word lines in the same layer are different and affecting the programming performance of the memory device.

SUMMARY

Embodiments of the present application are expected to provide a memory device, a programming method, and a memory system.

The technical solution of the present application is implemented as follows:

The first aspect of the embodiments of the present application provides a memory device, comprising:
  a memory cell array comprising a plurality of word lines and a plurality of bit lines;
  each of the word lines comprising at least two word line segments, each of the word line segments in the word line having different signal transmission distances from a word line driver, different word line segments in the word line corresponding to different bit lines respectively;
  the word line driver configured to apply a word line voltage to the word line;
  a bit line driver configured to apply different bias voltages to different bit lines corresponding to the different word line segments respectively during application of a programming pulse.

Optionally, each of the word lines comprises at least a first word line segment and a second word line segment, signal transmission distance between the first word line segment and the word line driver being larger than signal transmission distance between the second word line segment and the word line driver:
  the bit line driver is specifically configured to apply a first bias voltage to a bit line corresponding to the first word line segment, and apply a second bias voltage to a bit line corresponding to the second word line segment during the application of the programming pulse;
  wherein, the first bias voltage is lower than the second bias voltage.

Optionally, resistance of the first word line segment is larger than resistance of the second word line segment, the resistance of the first word line segment comprises resistance of the first word line segment itself and signal transmission path resistance between the first word line segment and the word line driver, the resistance of the second word line segment comprises resistance of the second word line segment itself and signal transmission path resistance between the second word line segment and the word line driver.

Optionally, the memory cell array further comprises memory cells comprising a first memory cell, a second memory cell and a third memory cell;
  the plurality of bit lines comprise a first set of bit lines connected to the first memory cell, a second set of bit lines connected to the second memory cell, and a third set of bit lines connected to the third memory cell;
  the bit line driver is configured to apply a first bit line voltage to the first set of bit lines, apply a second bit line voltage to the second set of bit lines, and apply a third bit line voltage to the third set of bit lines during the application of the programming pulse;
  wherein, the first bit line voltage is lower than the second bit line voltage, and the second bit line voltage is lower than the third bit line voltage.

Optionally, the first set of bit lines comprises a first bit line corresponding to the first word line segment and a second bit line corresponding to the second word line segment;
  the bit line driver is specifically configured to apply a first bias voltage to the first bit line and apply a second bias voltage to the second bit line respectively during the application of the programming pulse.

Optionally, the first bias voltage applied to the first bit line is lower than or equal to the first bit line voltage;
  the second bias voltage applied to the second bit line is larger than or equal to the first bit line voltage.

Optionally, the second set of bit lines comprises a third bit line corresponding to the first word line segment and a fourth bit line corresponding to the second word line segment;
  the bit line driver is specifically configured to apply a first bias voltage to the third bit line and apply a second bias voltage to the fourth bit line respectively during the application of the programming pulse.

Optionally, the first bias voltage applied to the third bit line is lower than or equal to the second bit line voltage:
  the second bias voltage applied to the fourth bit line is larger than or equal to the second bit line voltage.

Optionally, the third set of bit lines comprises a fifth bit line corresponding to the first word line segment and a sixth bit line corresponding to the second word line segment:
  the second bit line is adjacent to the third bit line, voltage on the sixth bit line being larger than the third bit line voltage.

Optionally, the first set of bit lines comprises a first bit line corresponding to the first word line segment and a second bit line corresponding to the second word line segment:
  bit lines in the second set of bit lines are adjacent to bit lines in the first set of bit lines, voltage on the second bit line being larger than the first bit line voltage.

The second aspect of the embodiments of the present application provides a programming method applied to a memory device, the memory device comprises a memory cell array comprising a plurality of word lines and a plurality of bit lines, the method comprising:
  applying a word line voltage to a word line by a word line driver, wherein each of the word lines comprises at least two word line segments, each of the word line segments in the word line having different signal transmission distances from the word line driver, different word line segments in the word line corresponding to different bit lines respectively;

applying different bias voltages to the different bit lines corresponding to the different word line segments by a bit line driver respectively during programming phase.

Optionally, each of the word lines comprises at least a first word line segment and a second word line segment, signal transmission distance between the first word line segment and the word line driver being larger than signal transmission distance between the second word line segment and the word line driver;

applying the different bias voltages to the different bit lines corresponding to the different word line segments by the bit line driver respectively during the programming phase comprises: applying a first bias voltage to a bit line corresponding to the first word line segment, and applying a second bias voltage to a bit line corresponding to the second word line segment during application of a programming pulse;

wherein, the first bias voltage is lower than the second bias voltage.

Optionally, resistance of the first word line segment is larger than resistance of the second word line segment, the resistance of the first word line segment comprises resistance of the first word line segment itself and signal transmission path resistance between the first word line segment and the word line driver, the resistance of the second word line segment comprises resistance of the second word line segment itself and signal transmission path resistance between the second word line segment and the word line driver.

Optionally, the memory cell array further comprises memory cells comprising a first memory cell, a second memory cell and a third memory cell;

the bit lines comprise a first set of bit lines connected to the first memory cell, a second set of bit lines connected to the second memory cell, and a third set of bit lines connected to the third memory cell;

the method further comprises:

applying a first bit line voltage to the first set of bit lines, applying a second bit line voltage to the second set of bit lines, and applying a third bit line voltage to the third set of bit lines by the bit line driver during the application of the programming pulse;

wherein, the first bit line voltage is lower than the second bit line voltage, and the second bit line voltage is lower than the third bit line voltage.

Optionally, the first set of bit lines comprises a first bit line corresponding to the first word line segment and a second bit line corresponding to the second word line segment;

applying the different bias voltages to the different bit lines corresponding to the different word line segments by the bit line driver respectively during the programming phase comprises: applying a first bias voltage to the first bit line and applying a second bias voltage to the second bit line respectively by the bit line driver during the application of the programming pulse.

Optionally, the first bias voltage of the first bit line is lower than or equal to the first bit line voltage;

the second bias voltage of the second bit line is larger than or equal to the first bit line voltage.

Optionally, the second set of bit lines comprises a third bit line corresponding to the first word line segment and a fourth bit line corresponding to the second word line segment;

applying the different bias voltages to the different bit lines corresponding to the different word line segments by the bit line driver respectively during the programming phase comprises: applying a first bias voltage to the third bit line and applying a second bias voltage to the fourth bit line respectively by the bit line driver during the application of the programming pulse.

Optionally, the first bias voltage applied to the third bit line is lower than or equal to the second bit line voltage;

the second bias voltage of the fourth bit line is larger than or equal to the second bit line voltage.

Optionally, the third set of bit lines comprises a fifth bit line corresponding to the first word line segment and a sixth bit line corresponding to the second word line segment;

bit lines in the second set of bit lines are adjacent to bit lines in the third set of bit lines, voltage on the sixth bit line being larger than the third bit line voltage.

Optionally, the first set of bit lines comprises a first bit line corresponding to the first word line segment and a second bit line corresponding to the second word line segment;

bit lines in the second set of bit lines are adjacent to bit lines in the first set of bit lines, voltage on the second bit line being larger than the first bit line voltage.

The third aspect of the embodiments of the present application provides a memory system, comprising a controller and the memory device according to the first aspect; the controller being coupled to the memory device and used to control the memory device.

The present application discloses a memory device, a programming method and a memory system, the memory device comprises: a memory cell array comprising a plurality of word lines and a plurality of bit lines, each of the word lines comprising at least two word line segments, each of the word line segments in the word line has different signal transmission distances from a word line driver; different word line segments in the word line corresponding to different bit lines respectively; the word line driver configured to apply a word line voltage to the word line; a bit line driver configured to apply different bias voltages to different bit lines corresponding to the different word line segments respectively during application of a programming pulse. The embodiments of the present application apply a lower bias voltage to the bit line corresponding to the first word line segment in the far distance, and apply a larger bias voltage to the bit line corresponding to the second word line segment in the short distance for each word line during the programming process to compensate for the voltage signal delay caused by the signal transmission distance between the first word line segment and the word line driver being larger than the signal transmission distance between the second word line segment and the word line driver, thus reducing programming time difference between different memory cells corresponding to word line segments with different signal transmission distances between the word lines in the same layer and the word line driver, thereby shortening programming time and improving programming performance of the memory device.

DETAILED DESCRIPTION

Figure 1:
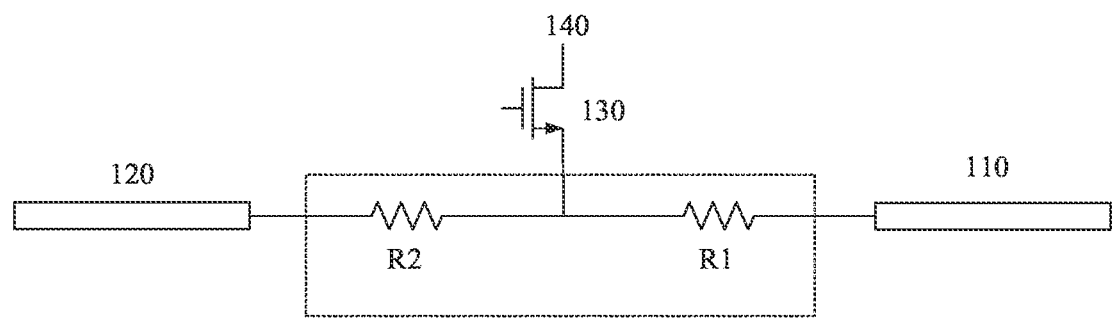
FIG. 1 is a schematic diagram of a connection relationship between a word line driver and a word line provided by an embodiment of the present application.

The technical solutions in the embodiments of the present application will be clearly and completely described below in conjunction with the drawings in the embodiments of the present application. Obviously, the described embodiments are only a part of the embodiments of the present application, rather than all of them. Based on the embodiments of the present application, all other embodiments obtained by those skilled in the art without creative work should fall within the scope of the present disclosure.

Furthermore, the drawings are merely schematic illustrations of the present application and are not necessarily drawn to scale. Same reference numerals in the drawings indicate same or similar parts, and thus repeat description will be omitted. Some of the block diagrams shown in the drawings are functional entities that do not necessarily correspond to physically or logically separate entities. These functional entities may be implemented in software, or in one or more hardware modules or integrated circuits, or in different networks and/or processor devices and/or microcontroller devices.

The flow charts shown in the drawings are merely illustrative and do not necessarily include all steps. For example, some steps can be decomposed, and some steps can be combined or partially combined, thus the actual order of performance may be changed according to actual situation.

The terms used herein are for the purpose of describing particular embodiments only but not intended to limit present application. As used herein, singular forms "a", "an" and "the" are intended to include plural forms as well, unless specifically stated otherwise in the context. It should also be understood that terms "compose of" and/or "include", when used in this specification, identify the presence of features, integers, steps, operations, elements and/or components, but do not exclude the presence or addition of one or more other features, integers, steps, operations, elements, parts and/or groups. As used herein, term "and/or" includes any of the associated listed items and combination thereof.

In some embodiments, referring to FIG. 1, which is a schematic diagram of a connection relationship between a word line driver and a word line provided by an embodiment of the present application. For example, the word line includes a first word line segment 110 and a second word line segment 120, which are connected to a local word line 140 through a word line driver 130 respectively, and signal transmission distance between the first word line segment 110 and the word line driver 130 is larger than signal transmission distance between the second word line segment 120 and the word line driver 130. Correspondingly, path resistance R1 between the first word line segment 110 and the word line driver 130 is larger than path resistance R2 between the second word line segment 120 and the word line driver 130. Due to that the resistance between the word line driver 130 and the first word line segment 110 is different from the resistance between the word line driver 130 and the second word line segment 120, the first word line segment 110 will reach the programming voltage later relative to the second word line segment 120 when a same word line voltage is applied to the first word line segment 110 and the second word line segment 120 respectively by the word line driver 130 during the programming process.

Figure 2:
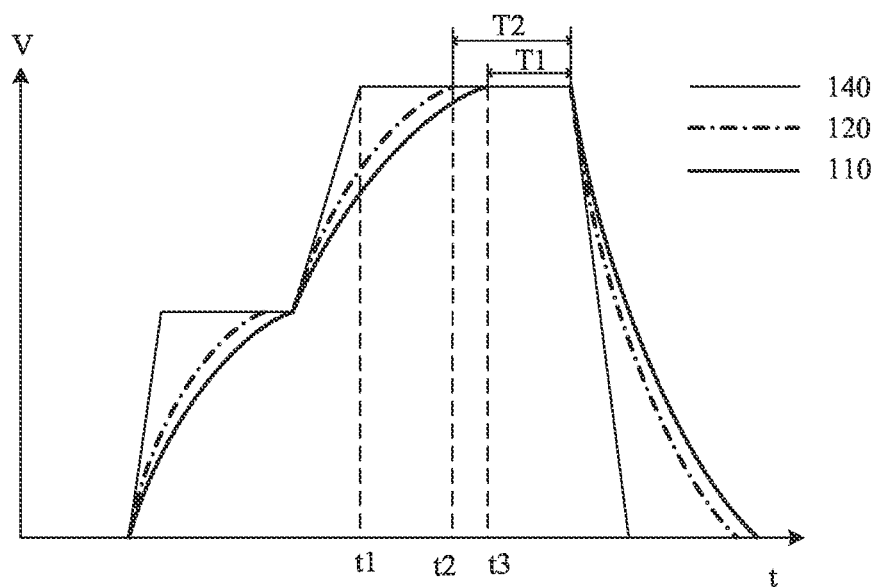
FIG. 2 is a timing diagram of programming voltages corresponding to a first word line segment and a second word line segment respectively provided by an embodiment of the present application.

For example, referring to FIG. 2, which is a timing diagram of programming voltages corresponding to the first word line segment and the second word line segment respectively provided by an embodiment of the present application. The vertical coordinate represents voltage, and the horizontal coordinate represents time. The voltage on the local word line 140 reaches the programming voltage at time t1, the voltage on the second word line segment 120 reaches the programming voltage at time 12, and the voltage on the first word line segment 110 reaches the programming voltage at time 13. It can be seen that the voltage on the second word line segment 120 reaches the programming voltage earlier than the voltage on the first word line segment 110, and the duration time T1 for which the voltage on the second word line segment 120 remains at the programming voltage is larger than the duration time T2 for which the voltage on the first word line segment 110 remains at the programming voltage, causing differences in programming rates of word line segments at different positions in each word line, affecting the programming performance of the memory device.

Figure 3:
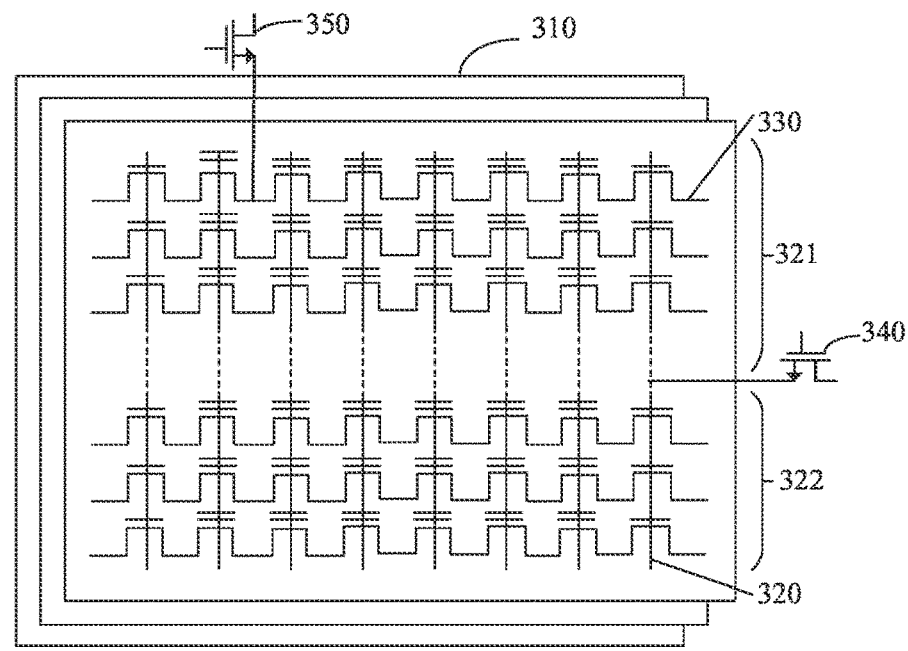
FIG. 3 is a structural schematic diagram of a memory device provided by an embodiment of the present application.

In light of this, a memory device is provided by an embodiment of the present application. Referring to FIG. 3, which is a structural schematic diagram of a memory device provided by an embodiment of the present application, the memory device includes:

a memory cell array 310: the memory cell array 310 comprises a plurality of word lines 320 and a plurality of bit lines 330 which coupled to corresponding memory cells respectively;

each of the word lines 320 comprising at least two word line segments; each of the word line segments in the word line has different signal transmission distances from a word line driver 340; different word line segments in the word line corresponding to different bit lines respectively;

the word line driver 340 configured to apply a word line voltage to the word line 320;

a bit line driver 350 configured to apply different bias voltages to different bit lines corresponding to the different word line segments respectively during application of a programming pulse.

In this embodiment, each of the word lines comprises a first word line segment 321 and a second word line segment 322; since that the signal transmission distance between the first word line segment 321 of each of the word lines and the word line driver 340 is larger than the signal transmission distance between the second word line segment 322 and the word line driver 340, the programming start time of the first word line segment 321 is later than the programming start time of the second word line segment 322. By applying a lower first bias voltage to the bit line corresponding to the first word line segment 321 and applying a larger second bias voltage to the bit line corresponding to the second word line segment 322, the signal delay caused by different signal transmission distances is compensated, and the programming time difference between the first word line segment and the second word line segment of each of the word lines is reduced.

In some embodiments, each of the word lines comprises at least a first word line segment and a second word line segment; signal transmission distance between the first word line segment and the word line driver is larger than signal transmission distance between the second word line segment and the word line driver;

the bit line driver is specifically configured to apply a first bias voltage to a bit line corresponding to the first word line segment, and apply a second bias voltage to a bit line corresponding to the second word line segment respectively during the application of the programming pulse;

wherein, the first bias voltage is lower than the second bias voltage.

Here, each of the word lines may further include a first word line segment, a second word line segment, a third word line segment and a fourth word line segment, wherein the signal transmission distance between the first word line segment, the second word line segment, the third word line segment and the fourth word line segment and the word line driver decreases sequentially, that is, the signal transmission distance between the first word line segment and the word line driver is the largest, and the signal transmission distance between the fourth word line segment and the word line driver is the smallest. Correspondingly, a first bias voltage is applied to the bit line corresponding to the first word line segment, a second bias voltage is applied to the bit line corresponding to the second word line segment, a third bias voltage is applied to the bit line corresponding to the third word line segment, and a fourth bias voltage is applied to the bit line corresponding to the fourth word line segment by the bit line driver during the programming process. Here, the first bias voltage is lower than the second bias voltage, the second bias voltage is lower than the third bias voltage, and the third bias voltage is lower than the fourth bias voltage. It should be noted that, each of the word lines may not be limited to have four word line segments, and may also be divided into more word line segments, which will not be enumerated here.

In some embodiments, the bit line driver is specifically configured to apply a first bias voltage to a bit line corresponding to the first word line segment, and apply a second bias voltage to a bit line corresponding to the second word line segment during the application of the programming pulse. Specifically, the memory cell coupled to the bit line to which the first bias voltage is applied has the same target programming state as the memory cell coupled to the bit line to which the second bias voltage is applied.

Figure 4A:
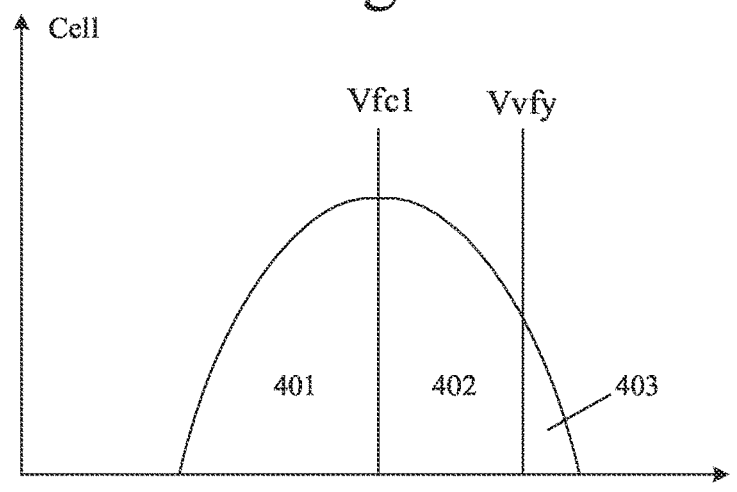
FIG. 4A is a distribution diagram of threshold voltage intervals of different memory cells provided by an embodiment of the present application.

In some embodiments, referring to FIG. 4A, which is a distribution diagram of threshold voltage intervals of different memory cells provided by the embodiments of the present application. The memory cells can be classified based on different verification voltages, for example, the memory cell may be classified by a programming verification voltage Vvfy and a forcing sensing voltage Vfc1 lower than the programming verification voltage Vvfy. Specifically, a memory cell with a threshold voltage lower than the forcing sensing voltage Vfc1 may be a memory cell on which a normal programming operation will be performed in the next programming process, and is referred to as a normal programming cell 401 here. A memory cell with a threshold voltage larger than the forcing sensing voltage Vfc1 and lower than the programming verification voltage Vvfy may be a memory cell on which a bit line forcing operation will be performed in the next programming process, and is referred to as a forcing cell 402 here. A memory cell with a threshold voltage larger than the programming verification voltage Vvfy may be a memory cell on which no programming operation will be performed in the next programming process, and is referred to as an inhibiting cell 403 here. It should be noted that a memory cell with a threshold voltage lower than the programming verification voltage Vvfy may be a programming cell (PGM Cell) which includes a normal programming cell 401 and a forcing cell 402. Here, the memory cells may be programmed using incremental step pulse programming (ISPP). The ISPP programming method programs selected memory cells several times while incrementally increasing the word line voltage based on the step voltage. The magnitude of this "step" (e.g., the increased magnitude of each pulse relative to the immediately preceding pulse) is referred to herein as the "pulse step height". Between each pulse with an increased magnitude, a verify operation is performed to check whether each of the selected memory cells has a threshold voltage that has been raised above the level of the verification voltage for that memory cell. The ISPP programming method continues, until the threshold voltage of each of the selected memory cells is raised above the corresponding verification voltage, such that the threshold voltage of each of the selected memory cells represents intended storage state.

In some embodiments, the memory cell array further includes memory cells, which include a first memory cell (for example, a memory cell with a threshold voltage lower than the forcing sensing voltage Vfc1 and on which a normal programming operation will be performed in the next programming process), a second memory cell (for example, a memory cell with a threshold voltage larger than the forcing sensing voltage Vfc1 and lower than the programming verification voltage Vvfy and on which a bit line forcing operation will be performed in the next programming process), and a third memory cell (for example, a memory cell with a threshold voltage larger than the programming verification voltage Vvfy and on which no programming operation will be performed in the next programming process); a plurality of bit lines including a first set of bit lines connected to the first memory cell, a second set of bit lines connected to the second memory cell, and a third set of bit lines connected to the third memory cell;

the bit line driver is configured to apply a first bit line voltage to the first set of bit lines, apply a second bit line voltage to the second set of bit lines, and apply a third bit line voltage to the third set of bit lines during the application of the programming pulse;

wherein, the first bit line voltage is lower than the second bit line voltage, and the second bit line voltage is lower than the third bit line voltage.

Figure 4B:
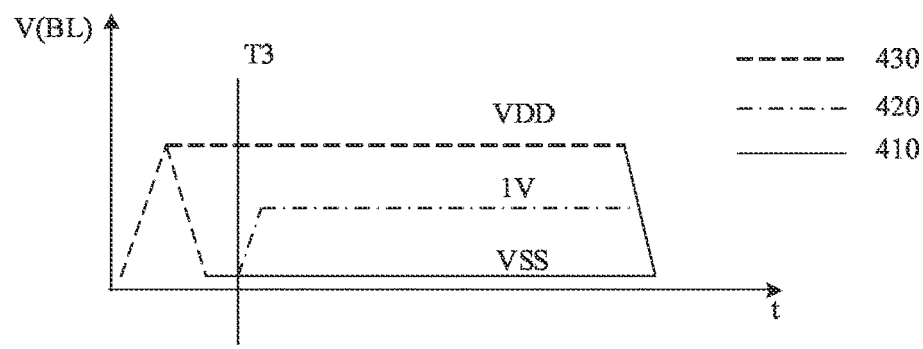
FIG. 4B is a timing diagram of bit line bias voltages corresponding to a first memory cell, a second memory cell, and a third memory cell respectively provided by an embodiment of the present application.

Exemplarily, referring to FIG. 4B, which is a timing diagram of bit line bias voltages corresponding to a first memory cell, a second memory cell, and a third memory cell respectively provided by an embodiment of the present application. The vertical coordinate represents voltage, the horizontal coordinate represents time, and T3 represents the moment when the bias voltage started to be applied. 410 represents the timing of the bit line bias voltage of the first set of bit lines; 420 represents the timing of the bit line bias voltage of the second set of bit lines; and 430 represents the timing of the bit line bias voltage of the third set of bit lines.

Here, before the programming operation, a high voltage (e.g., VDD) may also be applied to the bit line to perform a pre-charge operation. The potential in the channel is raised by drawing away (or neutralizing) electrons in the channel, so that the potential of the channel can be raised to a relatively high potential by the passing voltage of the non-programming string during the programming phase. Thus, the potential difference between the channel potential of the non-programming string and the programming voltage is reduced during the programming phase, thereby reducing programming disturbance.

In this embodiment, the first set of bit lines, the second set of bit lines and the third set of bit lines are bit lines corresponding to the normal programming cells 401, the forcing cells 402 and the inhibiting cells 403, respectively. A normal programming bit line voltage is applied to the first set of bit lines corresponding to the normal programming cells 401 by the bit line driver. A forcing programming bit line voltage higher than the normal programming bit line voltage and lower than the inhibiting programming bit line voltage is applied to the second set of bit lines corresponding to the forcing cells 402 by the bit line driver. An inhibiting programming bit line voltage is applied to the third set of bit lines corresponding to the inhibiting cells 403 by the bit line driver. For example, the normal programming bit line voltage Vprog may be the ground voltage VSS, such as 0 V. The inhibiting programming bit line voltage Vinh may be the supply voltage VDD, such as 2 V. The forcing programming voltage may be a voltage between the supply voltage VDD and the ground voltage VSS, such as 1 V. In some embodiments, the power supply voltage VDD is applied to the third set of bit lines corresponding to the inhibiting cells 403 before time T3, and the third bit line can be floated after time T3. After time T3, the ground voltage VSS is applied to the first set of bit lines corresponding to the normal programming cells 401, and the forcing programming voltage (e.g., 1 V) is applied to the second set of bit lines corresponding to the forcing cells 402, thus simplifying the bit line driver circuit and reduce the size of the memory device.

In this embodiment, the classification programming control is performed on different memory cells. The memory cells can be classified into normal programming cells, forcing cells and inhibiting cells, and the classification programming control is performed on these three types of memory cells using different bit line voltages.

Here, the first set of bit line voltage is the normal programming bit line voltage, the second set of bit line voltage is the forcing programming bit line voltage, and the third set of bit line voltage is the inhibiting programming bit line voltage. The normal programming bit line voltage is lower than the forcing programming bit line voltage, and the forcing programming bit line voltage is lower than the inhibiting programming bit line voltage.

Since the signal transmission distances from the memory cells corresponding to the first word line segment and the second word line segment of each word line to the word line driver are different, the programming rates of the memory cells corresponding to the first word line segment and the second word line segment are different. Therefore, during the programming process, classification control is required for the first word line segment and the second word line segment of each word line. In this embodiment, the voltage signal delay of the second word line segment, caused by the signal transmission distance between the first word line segment and the word line driver being lager than the signal transmission distance between the second word line segment and the word line driver, is compensated to the second word line segment by additionally applying a compensation bias voltage to the bit line corresponding to the second word line segment. In other words, the first word line segment and the second word line segment reach the programming voltage at substantially the same time by the compensation bias voltage, making the programming time difference between different memory cells corresponding to the second word line segment of the word line in the same layer reduced. Therefore, the voltage signal delay caused by the signal transmission distance between the word line and the word line driver being larger than the signal transmission distance between the second word line segment and the word line driver is compensated by making the voltage applied to the bit line corresponding to the first word line segment lower than the voltage applied to the bit line corresponding to the second word line segment. In a specific example, the voltage applied to the bit line corresponding to the first word line segment being lower than the voltage applied to the bit line corresponding to the second word line segment can be implemented by making the voltage applied to the bit line corresponding to the first word line segment is an original bias voltage (a first bias voltage), and the voltage applied to the bit line corresponding to the second word line segment is the original bias voltage + a compensation bias voltage (a second bias voltage). In another specific example, the voltage applied to the bit line corresponding to the first word line segment being lower than the voltage applied to the bit line corresponding to the second word line segment can also be implemented by making the voltage applied to the bit line corresponding to the first word line segment is an original bias voltage − a compensation bias voltage (a first bias voltage), and the voltage applied to the bit line corresponding to the second word line segment is the original bias voltage (a second bias voltage). Here, the compensation bias voltage is a positive value. It should be supplemented that the original bias voltage is the voltage applied to the bit line when the voltage signal delay compensation is not performed.

Figure 5A:
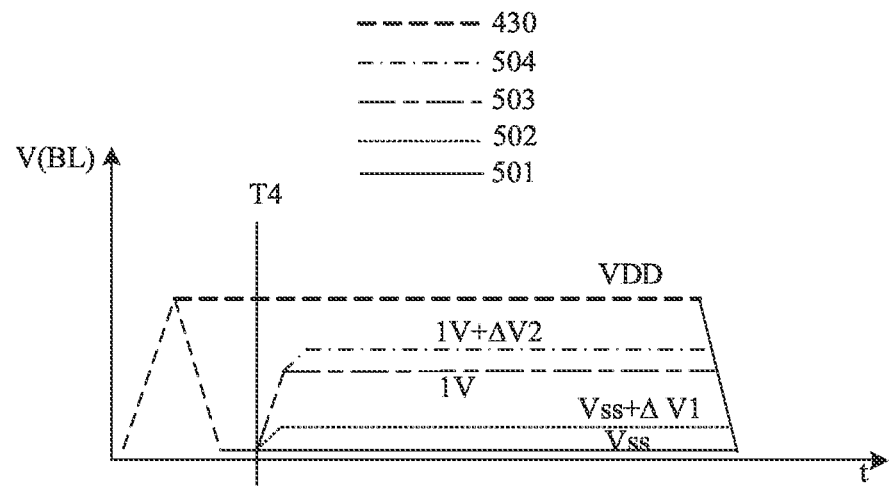
FIG. 5A is a first schematic diagram of bias voltages of a plurality of bit lines corresponding to different word line segments provided by an embodiment of the present application.

In some embodiments, referring to FIG. 5A, which is a first schematic diagram of bias voltages of a plurality of bit lines corresponding to different word line segments provided by an embodiment of the present application. 501 represents the timing of the bit line bias voltage of the first bit line; 502 represents the timing of the bit line bias voltage of the second bit line; 503 represents the timing of the bit line bias voltage of the third bit line; 504 represents the timing of the bit line bias voltage of the fourth bit line, and 430 represents the timing of the bit line bias voltage of the third set of bit lines. The first set of bit lines includes a first bit line corresponding to the first word line segment and a second bit line corresponding to the second word line segment; the bit line driver is specifically configured to respectively apply a first bias voltage to the first bit line and apply a second bias voltage to the second bit line respectively during the application of the programming pulse.

Here, before the programming operation, a high voltage (e.g., VDD) may also be applied to the bit line to perform a pre-charge operation. The potential in the channel is raised by drawing away (or neutralizing) electrons in the channel, so that the potential of the channel can be raised to a relatively high potential by the passing voltage of the non-programming string during the programming phase. Thus, the potential difference between the channel potential of the non-programming string and the programming voltage is reduced during the programming phase, thereby reducing programming disturbance. Since the signal transmission distance between the first word line segment corresponding to the first bit line and the word line driver is larger, the word line corresponding to the first bit line reaches the programming voltage later than the second word line segment corresponding to the second bit line. In the programming phase, VSS+ΔV1 is applied to the second bit line from time T4, and the first bit line is grounded, that is, the bias voltage on the first bit line is VSS, so that the time when the voltage on the second word line segment corresponding to the second bit line reaches the programming voltage can be delayed during the programming phase, thus reducing the programming time difference between the first word line segment corresponding to the first bit line and the second word line segment corresponding to the second bit line.

In some embodiments, the first bias voltage applied to the first bit line is lower than or equal to the first bit line voltage:
the second bias voltage applied to the second bit line is larger than or equal to the first bit line voltage.

In this embodiment, the first bit line voltage of the first set of bit lines is the normal programming bit line voltage, that is, the ground voltage VSS, such as 0 V. The first bias voltage of the first bit line is equal to the first bit line voltage, that is, the first bias voltage of the first bit line is VSS. The second bias voltage of the second bit line is larger than the first bit line voltage, that is, the second bias voltage of the second bit line can be VSS+ΔV1, and ΔV1 can be a voltage value lower than 1 V and larger than 0 V. In some embodiments, the specific value of ΔV1 is positively correlated with the difference between the path resistances R2 and R1 in the above embodiments, that is, the larger the difference between R2 and R1, the larger the ΔV1 In particular, when the path resistance difference between the first word line segment and the second word line segment on the word line and the word line driver is larger, the delay time of the voltage signal on the first word line segment is longer than the second word line segment during programming procedure. By applying a larger bias voltage to the bit line corresponding to the second word line segment with a smaller signal transmission distance to the word line driver, the programming time of the second word line segment with a smaller signal transmission distance to the word line driver is delayed, thus reducing the programming time difference between the first word line segment and the second word line segment.

In some embodiments, referring to FIG. 5A again, the second set of bit lines includes a third bit line corresponding to the first word line segment and a fourth bit line corresponding to the second word line segment; the bit line driver is specifically configured to apply the first bias voltage to the third bit line and apply the second bias voltage to the fourth bit line respectively during the application of the programming pulse.

Compared to the second word line segment corresponding to the fourth bit line, the first word line segment corresponding to the third bit line reaches the programming voltage later due to that the signal transmission distance between the first word line segment corresponding to the third bit line and the word line driver is larger. In the programming phase, a larger bias voltage than that of the third bit line is applied to the fourth bit line from time T4, so that the time when the second word line segment corresponding to the fourth bit line reaches the programming voltage can be delayed during the programming phase, reducing the programming time difference between the first word line segment corresponding to the third bit line and the second word line segment corresponding to the fourth bit line.

In some embodiments, the first bias voltage applied to the third bit line is lower than or equal to the second bit line voltage;
the second bias voltage applied to the fourth bit line is larger than or equal to the second bit line voltage.

In this embodiment, the first bias voltage of the third bit line is a forcing programming voltage, and the first bias voltage is equal to the second bit line voltage, that is, the first bias voltage may be 1 V. The second bias voltage of the fourth bit line is larger than the second bit line voltage, that is, the second bias voltage of the fourth bit line may be 1 V+ΔV2, wherein ΔV2 is a smaller positive value. It should be noted that the specific values of ΔV1 and ΔV2 can be the same or different. The difference between the second bias voltage of the fourth bit line and the first bias voltage of the third bit line may be equal to the difference between the second bias voltage of the second bit line and the first bias voltage of the first bit line.

In some embodiments, referring to FIG. 5A again, during the programming process, since the third set of bit lines is connected to an inhibiting programming bit line voltage, such as the power supply voltage VDD, the memory cells corresponding to the third set of bit lines will not be programmed. Therefore, there is no need to perform classification control on the word lines connected to the third set of bit lines, that is, it is only necessary to apply the inhibiting programming bit line voltage to the third set of bit lines. Specifically, a power supply voltage is applied to the third set of bit lines before time T4, and the third set of bit lines can be floated after time T4. Here, VDD is larger than the second bias voltage of the fourth bit line 504.

Figure 5B:
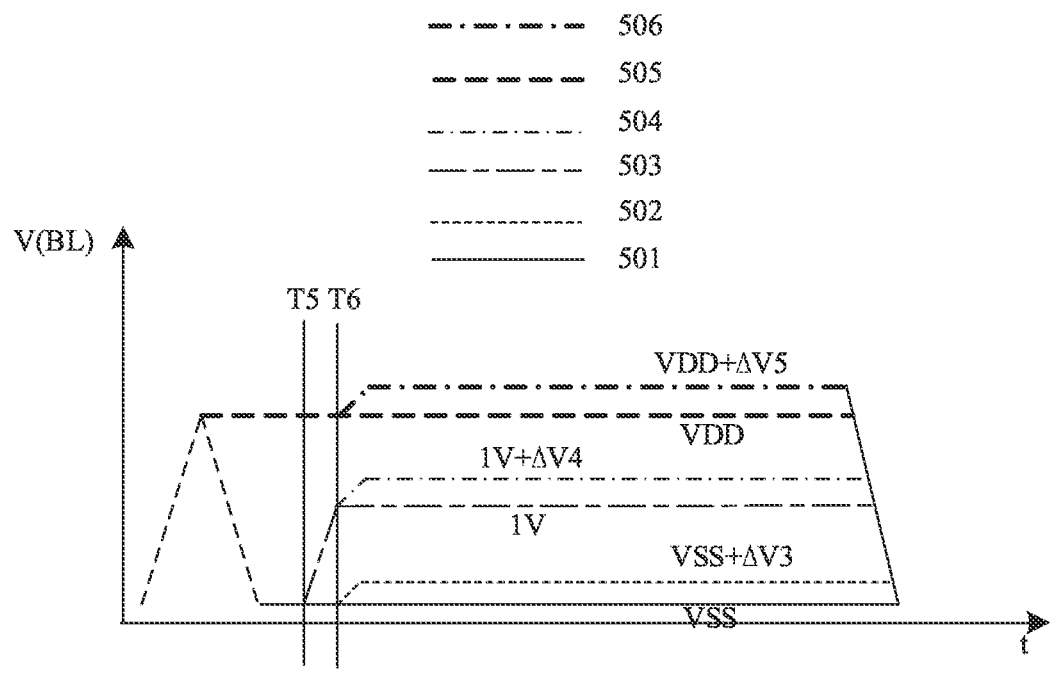
FIG. 5B is a second schematic diagram of bias voltages of a plurality of bit lines corresponding to different word line segments provided by an embodiment of the present application.

In some embodiments, referring to FIG. 5B, which is a second schematic diagram of bias voltages of a plurality of bit lines corresponding to different word line segments provided by an embodiment of the present application. 501 represents the timing of the bit line bias voltage of the first bit line; 502 represents the timing of the bit line bias voltage of the second bit line; 503 represents the timing of the bit line bias voltage of the third bit line; 504 represents the timing of the bit line bias voltage of the fourth bit line; 505 represents the timing of the bit line bias voltage of the fifth bit line; and 506 represents the timing of the bit line bias voltage of the sixth bit line. The third set of bit lines includes a fifth bit line corresponding to the first word line segment and a sixth bit line corresponding to the second word line segment:
bit lines in the second set of bit lines are adjacent to bit lines in the third set of bit lines; voltage on the sixth bit line is larger than the third bit line voltage.

Here, before the programming operation, a high voltage (e.g., VDD) may be applied to the bit line to perform a pre-charge operation. The pre-charge operation is to raise the potential in the channel by drawing away (or neutralizing) electrons in the channel, so that the potential of the channel can be raised to a relatively high potential by the passing voltage of the non-programming string during the programming phase. Thus, the potential difference between the channel potential of the non-programming string and the programming voltage is reduced during the programming phase, thereby reducing programming disturbance.

In this embodiment, the memory cells corresponding to the third set of bit lines do not perform programming operations. Therefore, after time T5, the third set of bit lines is in a floating state, and the fifth bit line is driven to VDD by the bit line driver and then floats. Since the bit lines in the second set of bit lines are adjacent to the bit lines in the third set of bit lines, the second set of bit lines is driven to the second bit line voltage (such as 1 V) by the bit line driver after time T6, so that after time T7, the voltage on the sixth bit line is larger than the third bit line voltage (e.g., VDD). Specifically, the fourth bit line in the second set of bit lines is adjacent to the sixth bit line in the third set of bit lines, and since the fourth bit line in the second set of bit lines is driven by the bit line driver to be larger than the second bit line voltage, for example, 1 V+ΔV4, so that after time T6, the voltage on the sixth bit line is larger than the third bit line voltage, for example, VDD+ΔV5.

In some embodiments, referring again to FIG. 5B, the first set of bit lines comprises a first bit line corresponding to the first word line segment and a second bit line corresponding to the second word line segment:

bit lines in the second set of bit lines are adjacent to bit lines in the first set of bit lines; voltage on the second bit line is larger than the first bit line voltage.

In this embodiment, a second bias voltage (e.g., 1 V) is applied to the fourth bit line in the second set of bit lines after time T6. Since the bit lines in the second set of bit lines are adjacent to the bit lines in the first set of bit lines and the second set of bit lines is driven to the second bit line voltage by the bit line driver, thus after time T6, the voltage on the second bit line is larger than the first bit line voltage (e.g., VSS). Specifically, the fourth bit line in the second set of bit lines is adjacent to the second bit line in the first set of bit lines, and since the fourth bit line in the second set of bit lines is driven by the bit line driver to be larger than the second bit line voltage, e.g., 1 V+ΔV4, so that the voltage on the second bit line is larger than the first bit line voltage, e.g., VSS+ΔV3. By applying the second bias voltage larger than the second bit line voltage to the fourth bit line in the second set of bit lines and reusing the capacitive coupling between bit lines, the operating voltage of the adjacent second bit line and the sixth bit line is larger than the first bit line voltage and the third bit line voltage. In this way, the second bit line and the sixth bit line that form parasitic capacitance with the fourth bit line can be controlled simultaneously and respectively by the bit line driver, that is, the classification control of the bit lines is implemented.

It should be noted that the times T3, T4 and T5 may be the times when the word line voltage is started to be applied to the word lines, that is, the times T3, T4 and T5 are the times when the programming starts.

In one embodiment, a programming method is provided by an embodiment of this application, applied to a memory device. The memory device comprises a memory cell array comprising a plurality of word lines and a plurality of bit lines, the method comprising:

applying a word line voltage to a word line by a word line driver, wherein each of the word lines comprises at least two word line segments; each of the word line segments in the word line has different signal transmission distances from the word line driver; different word line segments in the word line corresponding to different bit lines respectively;

applying different bias voltages to the different bit lines corresponding to the different word line segments by the bit line driver respectively during programming phase.

In the embodiment of the present application, since the signal transmission distance between the first word line segment of each word line and the word line driver is larger than the signal transmission distance between the second word line segment and the word line driver, the resistance of the first word line segment of each word line is larger than the resistance of the second word line segment. The resistance of the first word line segment comprises resistance of the first word line segment itself and signal transmission path resistance between the first word line segment and the word line driver; the resistance of the second word line segment comprises resistance of the second word line segment itself and signal transmission path resistance between the second word line segment and the word line driver. By applying a lower first bias voltage to the bit line corresponding to the first word line segment, and applying a larger second bias voltage to the bit line corresponding to the second word line segment, the voltage signal delay caused by the signal transmission distance is compensated, and the programming time difference between the first word line segment and the second word line segment of each word line is reduced. It should be noted that, the word line may further include a third word line segment, a fourth word line segment and the like according to the signal transmission distance from the word line driver. The specific example is as described in the above example of the memory device, and details are not repeated here.

In some embodiments, memory cells can be classified based on different verification voltages, for example, the memory cell may be classified by a programming verification voltage Vvfy and a forcing sensing voltage Vfc1 lower than the programming verification voltage Vvfy. Specifically, a memory cell with a threshold voltage level lower than the forcing sensing voltage Vfc1 may be a memory cell on which a normal programming operation will be performed in the next programming process, and is referred to as a normal programming cell here. A memory cell with a threshold voltage larger than the forcing sensing voltage Vfc1 and lower than the programming verification voltage Vvfy may be a memory cell on which a bit line forcing operation will be performed in the next programming process, and is referred to as a forcing cell here. A memory cell with a threshold voltage larger than the programming verification voltage Vvfy may be a memory cell on which no programming operation will be performed in the next programming process, and is referred to as an inhibiting cell here. It should be noted that a memory cell with a threshold voltage level lower than the programming verification voltage Vvfy may be a programming cell (PGM Cell) which includes a normal programming cell and a forcing cell.

In some embodiments, each of the word lines comprises at least a first word line segment and a second word line segment; signal transmission distance between the first word line segment and the word line driver is larger than signal transmission distance between the second word line segment and the word line driver;

applying the different bias voltages to the different bit lines corresponding to the different word line segments by the bit line driver respectively during the programming phase comprises: applying a first bias voltage to a bit line corresponding to the first word line segment, and applying a second bias voltage to a bit line corresponding to the second word line segment during application of a programming pulse;

wherein, the first bias voltage is lower than the second bias voltage.

In some embodiments, the memory cell array further comprises memory cells comprising a first memory cell, a second memory cell and a third memory cell, the bit lines comprise a first set of bit lines connected to the first memory cell, a second set of bit lines connected to the second memory cell, and a third set of bit lines connected to the third memory cell;

the method further comprises:
applying a first bit line voltage to the first set of bit lines, applying a second bit line voltage to the second set of bit lines, and applying a third bit line voltage to the third set of bit lines by the bit line driver during the application of the programming pulse;
wherein, the first bit line voltage is lower than the second bit line voltage, and the second bit line voltage is lower than the third bit line voltage.

In this embodiment, the first set of bit lines, the second set of bit lines, and the third set of bit lines are bit lines corresponding to the normal programming cells, forcing cells, and inhibiting cells, respectively. The normal programming bit line voltage is applied to the first set of bit lines corresponding to the normal programming cells by the bit line driver. The forcing programming bit line voltage which is higher than the normal programming bit line voltage and lower than the inhibiting programming bit line voltage is applied to the second set of bit lines corresponding to the forcing cells by the bit line driver. The inhibiting programming bit line voltage is applied to the third set of bit lines corresponding to the inhibiting cells by the bit line driver.

In some embodiments, a power supply voltage VDD is applied to the third set of bit lines corresponding to the inhibiting cells before time T1. The third set of bit lines can be floated after time T1. The ground voltage VSS is applied to the first set of bit lines corresponding to the normal programming cells, and the forcing programming voltage (e.g., 1 V) is applied to the second set of bit lines corresponding to the forcing cells after time T1, to simplify the bit line driver circuit and reduce the size of the memory device.

In this embodiment, the classification programming control is performed on different memory cells. The memory cells can be classified into normal programming cells, forcing cells and inhibiting cells, and the classification programming control is performed on these three types of memory cells using different bit line voltages. Here, the first bit line voltage is the normal programming bit line voltage, the second bit line voltage is the forcing programming bit line voltage, and the third bit line voltage is the inhibiting programming bit line voltage. The normal programming bit line voltage is lower than the forcing programming bit line voltage, and the forcing programming bit line voltage is lower than the inhibiting programming bit line voltage.

In some embodiments, the first set of bit lines comprises a first bit line corresponding to the first word line segment and a second bit line corresponding to the second word line segment;

applying the different bias voltages to the different bit lines corresponding to the different word line segments by the bit line driver during the programming phase comprises: applying a first bias voltage to the first bit line and applying a second bias voltage to the second bit line respectively by the bit line driver during the application of the programming pulse.

Compared to the second word line segment corresponding to the second bit line, the signal transmission distance between the first word line segment corresponding to the first bit line and the word line driver is larger, therefore, the first word line segment corresponding to the first bit line reaches the programming voltage later. In the programming phase, a larger bias voltage is applied to the second bit line than the first bit line from time T4, thereby delaying the time when the second word line segment corresponding to the second bit line reaches the programming voltage in the programming process, thus reducing the programming time difference between the first word line segment corresponding to the first bit line and the second word line segment corresponding to the second bit line.

In some embodiments, the first bias voltage applied to the first bit line is lower than or equal to the first bit line voltage;
the second bias voltage applied to the second bit line is larger than or equal to the first bit line voltage.

In this embodiment, the first bit line voltage of the first set of bit lines is the normal programming bit line voltage, that is, the ground voltage VSS, such as 0 V. The first bias voltage of the first bit line is equal to the first bit line voltage, that is, the first bias voltage of the first bit line may be VSS. The second bias voltage of the second bit line is larger than the first bit line voltage, that is, the second bias voltage of the second bit line may be VSS+$\Delta$V1, wherein $\Delta$V1 may be a voltage value lower than 1 V and larger than 0 V.

In some embodiments, the second set of bit lines comprises a third bit line corresponding to the first word line segment and a fourth bit line corresponding to the second word line segment;

applying the different bias voltages to the different bit lines corresponding to the different word line segments by the bit line driver respectively during the programming phase comprises: applying a first bias voltage to the third bit line and applying a second bias voltage to the fourth bit line respectively by the bit line driver during the application of the programming pulse.

Compared to the second word line segment corresponding to the fourth bit line, the signal transmission distance between the first word line segment corresponding to the third bit line and the word line driver is larger, therefore, the first word line segment corresponding to the third bit line reaches the programming voltage later. In the programming phase, a larger bias voltage is applied to the fourth bit line than the third bit line from time T4, thereby delaying the time when the second word line segment corresponding to the fourth bit line reaches the programming voltage in the programming process, thus reducing the programming time difference between the first word line segment corresponding to the third bit line and the second word line segment corresponding to the fourth bit line.

In some embodiments, the first bias voltage applied to the third bit line is lower than or equal to the second bit line voltage;
the second bias voltage applied to the fourth bit line is larger than or equal to the second bit line voltage.

In this embodiment, the first bias voltage of the third bit line is a forcing programming voltage, and the first bias voltage equals to the second bit line voltage, which may be 1 V. The second bias voltage of the fourth bit line is larger than the second bit line voltage, that is, the second bias voltage of the fourth bit line may be 1V+$\Delta$V2, wherein $\Delta$V2 is a smaller positive voltage value.

In some embodiments, the third set of bit lines comprises a fifth bit line corresponding to the first word line segment and a sixth bit line corresponding to the second word line segment;
bit lines in the second set of bit lines are adjacent to bit lines in the third set of bit lines; voltage on the sixth bit line is larger than the third bit line voltage.

In this embodiment, the memory cells corresponding to the third set of bit lines do not perform programming operations. Because the bit lines in the second set of bit lines are adjacent to the bit lines in the third set of bit lines and the second set of bit lines is driven to the second bit line voltage (e.g., 1 V) by the bit line driver, the voltage on the sixth bit line is larger than the third bit line voltage (e.g., VDD). Specifically, the fourth bit line in the second set of bit lines is adjacent to the sixth bit line in the third set of bit lines, and since the voltage on the fourth bit line in the second set of bit lines is larger than the second bit line voltage, for example, 1 V+ΔV, the voltage on the sixth bit line is larger than the third bit line voltage, such as VDD+ΔV5.

In some embodiments, the first set of bit lines comprises a first bit line corresponding to the first word line segment and a second bit line corresponding to the second word line segment;

bit lines in the second set of bit lines are adjacent to bit lines in the first set of bit lines; voltage on the second bit line is larger than the first bit line voltage.

In this embodiment, since the second set of bit lines is adjacent the first set of bit lines and the second set of bit lines is driven to the second bit line voltage (e.g., 1 V) by the bit line driver, the voltage applied on the second bit line is larger than the first bit line voltage (e.g., VSS). Specifically, the fourth bit line in the second set of bit lines is adjacent to the second bit line in the first set of bit lines, and since the voltage on the fourth bit line in the second set of bit lines is larger than the second bit line voltage, for example, 1 V+ΔV4, the voltage on the second bit line is larger than the first bit line voltage, such as VSS+ΔV3.

Figure 6:
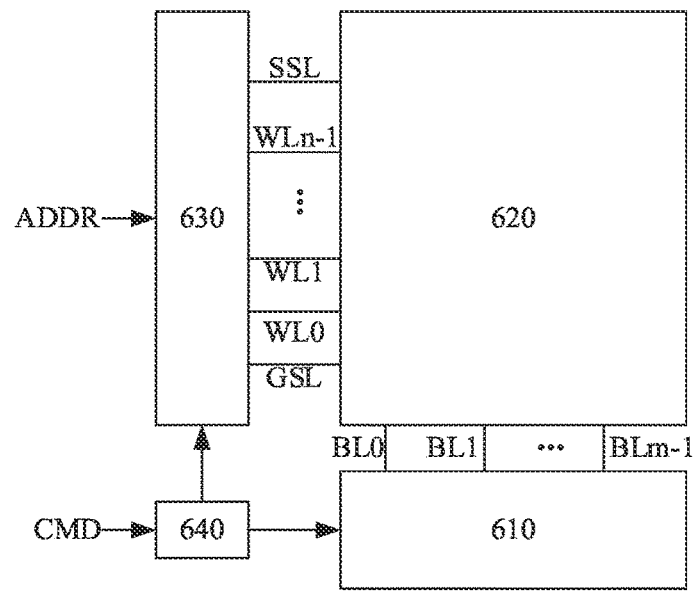
FIG. 6 is a schematic diagram of a memory device provided by an embodiment of the present application.

FIG. 6 is a schematic diagram of a memory device provided by an embodiment of the present application Referring to 6, a memory device may include a bit line unit 610, a memory cell array 620, a word line unit 630, and a control logic 640. The bit line unit 610, the word line unit 630, and the control logic 140 may be implemented in in a peripheral circuit of the memory device. Although the memory device is shown as a flash memory device such as vertical NAND flash memory as an example, it is to be understood that example solutions or techniques of the present disclosure are not limited to be applied in the flash memory devices, but can be applied to other types of non-volatile memories that need to apply different bit line voltages to different programming units separately during programming, such as read only memory (ROM), programmable read only memory (PROM), erasable programmable read only memory (EPROM), electrically erasable programmable read only memory (EEPROM), phase change random access memory (PRAM), magneto resistive random access memory (MRAM), resistive random access memory (RRAM), ferroelectric random access memory (FRAM), and so on.

The bit line unit 610 may function as a write driver or as a sense amplifier depending on the mode of operation. During a programming operation, the bit line unit 610 may transmit bit line voltages corresponding to memory cells to be programmed (which may also be referred to simply as "programming cells") to bit lines of the memory cell array 620. During a read operation, the bit line unit 610 may sense data stored in a selected memory cell by the bit line. The bit line unit 610 may latch the sensed data and output the latched data.

Memory cells in the memory cell array 620 may be composed of for example a plurality of NAND memory cells arranged in rows and columns, wherein each row of memory cells is connected to corresponding word lines, and each column of memory cells is connected to corresponding bit lines. The memory cell array 620 may be connected to a word line unit 630 via word lines WL0 to WLn−1, cell string select lines SSL, and ground select lines GSL. During programming process, the control logic 640 may control the voltage biased on the word line WL, for example, control the programming voltage Vpgm biased on a selected word line, so as to program the memory cells to be programmed on the selected word line to a certain data state. The memory cell array 620 may be connected to a bit line unit 610 via bit lines BL0 to BLm−1. The memory cell array 620 may include a plurality of memory cell strings, and each memory cell string may be connected to a bit line via a cell string selection line SST. The memory cell array 620 may be composed of a memory plane including a plurality of memory blocks, and the plurality of memory blocks may include a plurality of memory pages, and the plurality of memory pages may include a plurality of memory cells. The structure of the memory cell is shown in FIG. 3. For a specific example, please refer to the above method instance, which will not be described here.

The word line unit 630 may select any one of the memory blocks of the memory cell array 620 in response to the address ADDR. The word line unit 630 may select any one of the word lines of the selected memory block. The word line unit 630 may transmit the word line voltage to the word line of the selected memory block.

The control logic 640 may receive a programming command CMD, and output various control signals for controlling the bit line unit 610 and the word line unit 630 to perform programming operations in response to the programming command CMD. The control logic 640 may be implemented by the processor/processing core and corresponding firmware program in the peripheral circuit specifically.

Figure 7:
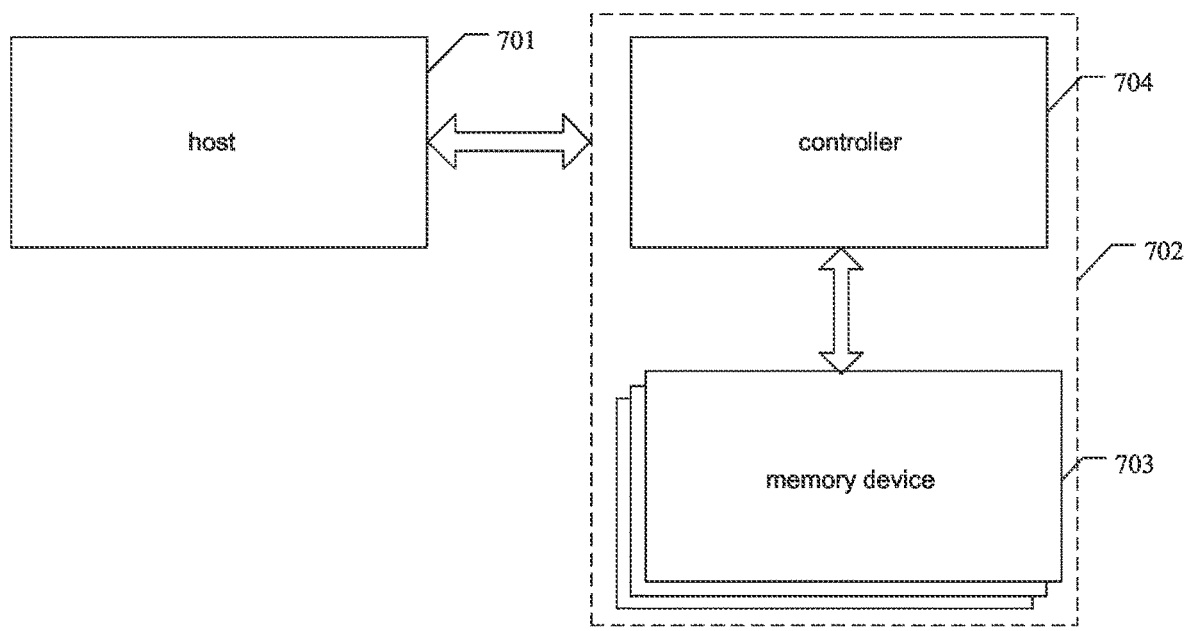
FIG. 7 is a structural schematic diagram of an electronic device provided by an embodiment of the present application.

In some embodiments, referring to FIG. 7, which is a structural schematic diagram of an electronic device provided by an embodiment of the present application. The electronic device may be mobile phone, desktop, laptop, tablet, vehicle computer, game console, printer, positioning device, wearable electronic device, smart sensor, virtual reality (VR) device, augmented reality (AR) device or any other suitable electronic device having storage therein. A host 701 may be a processor (e.g., a central processing unit (CPU)) or a system on chip (SoC) (e.g., an application processor (AP)) of the electronic device. Device 702 may be a storage system of the electronic device, comprising a controller 704 and one or more memory devices 703.

In some embodiments, the controller 704 is coupled to memory device 703 and host 701 and is configured to control the memory device 703. The memory device 703 (e.g., a NAND flash memory device) may store more than one single bit of information into each memory cell in multiple levels (also known as states), in order to increase storage capacity and reduce cost per bit. The controller 704 may manage data stored in the memory device 703 and communicate with the host 701. In some implementations, the controller 704 is designed to operate in a low duty cycle environment, such as a secure digital (SD) card, compact flash (CF) card, universal serial bus (USB) flash drive, or other media for use in electronic devices such as personal calculators, digital cameras, mobile phones, and the like. In some implementations, the controller 704 is designed to operate in a high duty-cycle environment SSDs or embedded multi-media-cards (eMMCs) used as data storage for mobile devices, such as smartphones, tablets, laptop computers, etc., and enterprise storage arrays. Controller 704 can be configured to control operations of memory device 703, such as read, erase, and programming operations. The controller 704 may also be configured to manage various functions with respect to the data stored or to be stored in memory device 703 including, but not limited to bad-block management, garbage collection, logical-to-physical address conversion, wear leveling, etc.

In some implementations, the controller 704 is also configured to process error correction codes (ECCs) with respect to the data read from or written to memory device 703. Any other suitable functions may be performed by the controller 704 as well, for example, formatting the memory device 703. The controller 704 can communicate with an external device (e.g., host 701) according to a particular communication protocol. For example, the controller 704 may communicate with the external device through at least one of various interface protocols, such as a USB protocol, an multi-media-card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

A memory system is further provided by an embodiment of the present application, including a controller and the above-mentioned memory device; the controller is coupled to the memory device and used to control the memory device.

The controller and one or more memory devices can be integrated into various types of storage devices, for example, being included in the same package, such as a universal Flash storage (UFS) package or an eMMC package. That is, the memory system can be implemented and packaged into different types of end electronic products.

Figure 8A:
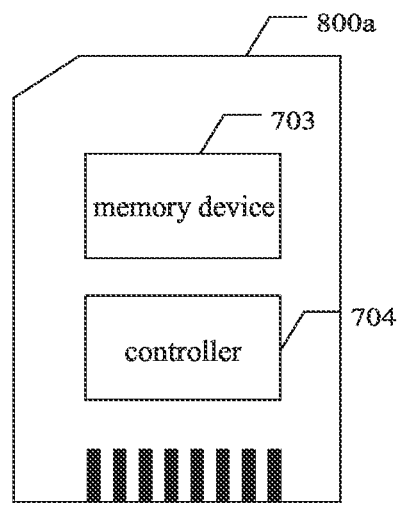
FIG. 8A is a first schematic diagram of a memory system provided by an embodiment of the present application.

In one example, as shown in FIG. 8A, the controller 704 and a single memory device 703 may be integrated into a memory card 800a. Memory card 800a can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc.

Figure 8B:
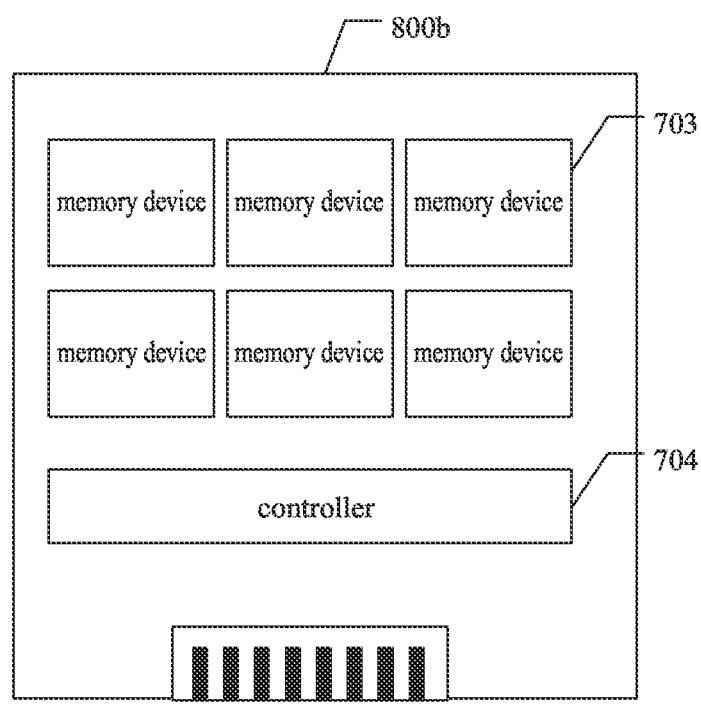
FIG. 8B is a second schematic diagram of a memory system provided by an embodiment of the present application.

In another example, as shown in FIG. 8B, the controller 704 and the plurality of memory devices 703 may be integrated into an SSD 800b. In some implementations, the storage capacity and/or the operation speed of SSD 800b is greater than those of memory card 800a.

Of course, in other examples, the memory system may further include multiple memory devices and multiple corresponding controllers, which will not be enumerated here.

The methods disclosed in several method embodiments provided in this application may be combined arbitrarily without conflict in order to obtain new method embodiments.

The features disclosed in several product embodiments provided in this application may be combined arbitrarily without conflict in order to obtain new product embodiments.

The features disclosed in several method or device embodiments provided in this application may be combined arbitrarily without conflict in order to obtain new method embodiments or device embodiments.

In the several embodiments provided in this application, it should be understood that the disclosed method and device may be implemented in other manners. The device embodiments described above are only illustrative. For example, the division of the modules is only a logical function division, and there may be other division manners in actual implementations, for example, multiple modules or components may be combined, or may be integrated into another system, or some features can be ignored, or not performed. In addition, the coupling, direct coupling or communication connection between the components shown or discussed may be through some interfaces, and the indirect coupling or communication connection between devices or modules may be electrical, mechanical or in other forms.

The modules described as separate components above may or may not be physically separated, and the components displayed as modules may or may not be physical units, that is, they may be located in one place or distributed across multiple network modules. Some or all of the modules may be selected according to actual needs to achieve the purpose of the solution in this embodiment.

In addition, each functional module in each embodiment of the present application may all be integrated into one processing module, or each module may be separately used as a module, or two or more modules may be integrated into one module. The integrated modules above may be implemented in hardware or in hardware plus software function module.

The above are only specific implementations of the present application, the protection scope of the present application is not limited to this. The variation and placement are obvious for those skilled in the art within the scope of protection of this application, and should be covered by the protection scope of this application Therefore, the protection scope of the present application should be subject to the claims.

What is claimed is:

1. A memory device, comprising:
a memory cell array comprising a plurality of word lines and a plurality of bit lines;
each of the word lines comprising at least two word line segments, each of the word line segments in the word line having different signal transmission distances from a word line driver, different word line segments in the word line corresponding to different bit lines respectively;
the word line driver configured to apply a word line voltage to the word line; and
a bit line driver configured to apply different bias voltages to different bit lines corresponding to the different word line segments respectively during application of a programming pulse.

2. The memory device according to claim 1, wherein:
each of the word lines comprises at least a first word line segment and a second word line segment, signal transmission distance between the first word line segment and the word line driver being larger than signal transmission distance between the second word line segment and the word line driver; and
the bit line driver is specifically configured to apply a first bias voltage to a bit line corresponding to the first word line segment, and apply a second bias voltage to a bit line corresponding to the second word line segment respectively during the application of the programming pulse,
wherein the first bias voltage is lower than the second bias voltage.

3. The memory device according to claim 2, wherein:
resistance of the first word line segment is larger than resistance of the second word line segment;
the resistance of the first word line segment comprises resistance of the first word line segment itself and signal transmission path resistance between the first word line segment and the word line driver; and the resistance of the second word line segment comprises resistance of the second word line segment itself and signal transmission path resistance between the second word line segment and the word line driver.

4. The memory device according to claim 2, wherein:
the memory cell array further comprises memory cells comprising a first memory cell, a second memory cell and a third memory cell;
the plurality of bit lines comprise a first set of bit lines connected to the first memory cell, a second set of bit lines connected to the second memory cell, and a third set of bit lines connected to the third memory cell; and
the bit line driver is configured to apply bit line bias voltages to the first set of bit lines, the second set of bit lines and the third set of bit lines respectively based on a first bit line voltage, a second bit line voltage and a third bit line voltage during the application of the programming pulse,
wherein the first bit line voltage is lower than the second bit line voltage, and the second bit line voltage is lower than the third bit line voltage.

5. The memory device according to claim 4, wherein:
the first set of bit lines comprises a first bit line corresponding to the first word line segment and a second bit line corresponding to the second word line segment; and
the bit line driver is specifically configured to apply the first bias voltage to the first bit line and apply the second bias voltage to the second bit line respectively during the application of the programming pulse.

6. The memory device according to claim 5, wherein:
the first bias voltage applied to the first bit line is lower than or equal to the first bit line voltage; and
the second bias voltage applied to the second bit line is larger than or equal to the first bit line voltage.

7. The memory device according to claim 4, wherein:
the second set of bit lines comprises a third bit line corresponding to the first word line segment and a fourth bit line corresponding to the second word line segment; and
the bit line driver is specifically configured to apply the first bias voltage to the third bit line and apply the second bias voltage to the fourth bit line respectively during the application of the programming pulse.

8. The memory device according to claim 7, wherein:
the first bias voltage applied to the third bit line is lower than or equal to the second bit line voltage; and
the second bias voltage applied to the fourth bit line is larger than or equal to the second bit line voltage.

9. The memory device according to claim 4, wherein:
the third set of bit lines comprises a fifth bit line corresponding to the first word line segment and a sixth bit line corresponding to the second word line segment; and
bit lines in the second set of bit lines are adjacent to bit lines in the third set of bit lines, voltage on the sixth bit line being larger than the third bit line voltage.

10. The memory device according to claim 4, wherein:
the first set of bit lines comprises a first bit line corresponding to the first word line segment and a second bit line corresponding to the second word line segment; and
bit lines in the second set of bit lines are adjacent to bit lines in the first set of bit lines, voltage on the second bit line being larger than the first bit line voltage.

11. A programming method for a memory device, wherein the memory device comprises a memory cell array comprising a plurality of word lines and a plurality of bit lines, the method comprising:
applying a word line voltage to a word line by a word line driver, wherein each of the word lines comprises at least two word line segments, each of the word line segments in the word line having different signal transmission distances from the word line driver, different word line segments in the word line corresponding to different bit lines respectively; and
applying different bias voltages to the different bit lines corresponding to the different word line segments by a bit line driver respectively during programming phase.

12. The programming method according to claim 11, wherein the applying of the different bias voltages to the different bit lines corresponding to the different word line segments by the bit line driver respectively during the programming phase comprises:
applying a first bias voltage to a bit line corresponding to a first word line segment, and applying a second bias voltage to a bit line corresponding to a second word line segment respectively during application of a programming pulse, wherein:
each of the word lines comprises at least the first word line segment and the second word line segment, signal transmission distance between the first word line segment and the word line driver being larger than signal transmission distance between the second word line segment and the word line driver; and
the first bias voltage is lower than the second bias voltage.

13. The programming method according to claim 12, wherein:
resistance of the first word line segment is larger than resistance of the second word line segment;
the resistance of the first word line segment comprises resistance of the first word line segment itself and signal transmission path resistance between the first word line segment and the word line driver; and
the resistance of the second word line segment comprises resistance of the second word line segment itself and signal transmission path resistance between the second word line segment and the word line driver.

14. The programming method according to claim 12, further comprising applying bit line bias voltages to a first set of bit lines, a second set of bit lines and a third set of bit lines respectively based on a first bit line voltage, a second bit line voltage and a third bit line voltage by the bit line driver during the application of the programming pulse, wherein:
the memory cell array further comprises memory cells comprising a first memory cell, a second memory cell and a third memory cell;
the bit lines comprise the first set of bit lines connected to the first memory cell, the second set of bit lines connected to the second memory cell, and the third set of bit lines connected to the third memory cell;
the first bit line voltage is lower than the second bit line voltage; and
the second bit line voltage is lower than the third bit line voltage.

15. The programming method according to claim 14, wherein the applying of the different bias voltages to the different bit lines corresponding to the different word line segments by the bit line driver respectively during the programming phase further comprises applying a first bias voltage to a first bit line and applying a second bias voltage to a second bit line respectively by the bit line driver during the application of the programming pulse, wherein the first set of bit lines comprises the first bit line corresponding to the first word line segment and the second bit line corresponding to the second word line segment.

16. The programming method according to claim 15, wherein:
the first bias voltage applied to the first bit line is lower than or equal to the first bit line voltage; and
the second bias voltage applied to the second bit line is larger than or equal to the first bit line voltage.

17. The programming method according to claim 14, wherein the applying of the different bias voltages to the different bit lines corresponding to the different word line segments by the bit line driver respectively during the programming phase further comprises applying a first bias voltage to a third bit line and applying a second bias voltage to a fourth bit line respectively by the bit line driver during the application of the programming pulse, wherein the second set of bit lines comprises the third bit line corresponding to the first word line segment and the fourth bit line corresponding to the second word line segment.

18. The programming method according to claim 14, wherein:
the third set of bit lines comprises a fifth bit line corresponding to the first word line segment and a sixth bit line corresponding to the second word line segment; and
bit lines in the second set of bit lines are adjacent to bit lines in the third set of bit lines, voltage on the sixth bit line being larger than the third bit line voltage.

19. The programming method according to claim 14, wherein:
the first set of bit lines comprises a first bit line corresponding to the first word line segment and a second bit line corresponding to the second word line segment; and
bit lines in the second set of bit lines are adjacent to bit lines in the first set of bit lines, voltage on the second bit line being larger than the first bit line voltage.

20. A memory system, comprising:
a controller; and
a memory device, the controller being coupled to the memory device and used to control the memory device, wherein the memory device comprises:
a memory cell array comprising a plurality of word lines and a plurality of bit lines;
each of the word lines comprising at least two word line segments, each of the word line segments in the word line having different signal transmission distances from a word line driver, different word line segments in the word line corresponding to different bit lines respectively;
the word line driver configured to apply a word line voltage to the word line; and
a bit line driver configured to apply different bias voltages to different bit lines corresponding to the different word line segments respectively during application of a programming pulse.

\* \* \* \* \*

UNITED STATES PATENT AND TRADEMARK OFFICE
CERTIFICATE OF CORRECTION

PATENT NO. : 12,183,399 B2  
APPLICATION NO. : 18/147537  
DATED : December 31, 2024  
INVENTOR(S) : Qiao et al.

Page 1 of 1

It is certified that error appears in the above-identified patent and that said Letters Patent is hereby corrected as shown below:

On the Title Page

Item (54), and in the Specification Column 1, Lines 1-2, delete "MEMORY DEVICE, PROGRAMMING METHOD AND MEMORY SYSTEM" and insert --A MEMORY DEVICE, PROGRAMMING METHOD AND MEMORY SYSTEM--.

Signed and Sealed this  
Fourth Day of February, 2025

Coke Morgan Stewart  
*Acting Director of the United States Patent and Trademark Office*